United States Patent
Hesthaven et al.

(10) Patent No.: US 8,942,456 B2
(45) Date of Patent: Jan. 27, 2015

(54) IMAGE RECONSTRUCTION FROM INCOMPLETE FOURIER MEASUREMENTS AND PRIOR EDGE INFORMATION

(71) Applicants: Jan S. Hesthaven, East Greenwich, RI (US); Edward G. Walsh, Danielson, CT (US)

(72) Inventors: Jan S. Hesthaven, East Greenwich, RI (US); Edward G. Walsh, Danielson, CT (US)

(73) Assignee: Brown University, Providence, RI (US)

( * ) Notice: Subject to any disclaimer, the term of this patent is extended or adjusted under 35 U.S.C. 154(b) by 210 days.

(21) Appl. No.: 13/722,311

(22) Filed: Dec. 20, 2012

(65) Prior Publication Data

US 2014/0023253 A1 Jan. 23, 2014

Related U.S. Application Data

(60) Provisional application No. 61/673,936, filed on Jul. 20, 2012.

(51) Int. Cl.

| G06K 9/00 | (2006.01) |
| G01R 33/561 | (2006.01) |
| G01R 33/563 | (2006.01) |
| G06T 11/00 | (2006.01) |
| A61B 5/05 | (2006.01) |
| G01R 33/48 | (2006.01) |

(52) U.S. Cl.
CPC .......... *G06T 11/003* (2013.01); *G01R 33/5619* (2013.01); *G01R 33/4824* (2013.01); *G01R 33/56308* (2013.01)

USPC .......................................... 382/131; 600/410

(58) Field of Classification Search
CPC ............... G06K 9/00; G01R 1/00; G06T 1/00
USPC ......... 382/128, 129, 130, 131, 132, 133, 134; 378/4, 8, 21–27, 62, 63, 87, 176, 901; 600/410, 411, 425, 427, 463; 128/920, 128/922

See application file for complete search history.

(56) References Cited

U.S. PATENT DOCUMENTS

| 7,768,264 B1 * | 8/2010 | Brau et al. ................ 324/309 |
| 8,331,637 B2 * | 12/2012 | Bar-Aviv et al. ............. 382/128 |

* cited by examiner

*Primary Examiner* — Abolfazl Tabatabai
(74) *Attorney, Agent, or Firm* — Chapin IP Law, LLC

(57) ABSTRACT

Systems and methods of image reconstruction that can reduce the number of Fourier transform measurements required to obtain an exact or stable reconstruction of target images, using prior edge information obtained from a reference image. Full-sampled, 2 or 3-dimensional Fourier transform measurements are obtained for the reference image prior to performing a time series study. Based on the reference image sharing similar edge information with a time series of sparse-gradient images, the number of Fourier transform measurements required to reconstruct the target images can be reduced by using compressed sensing techniques to obtain the sparse-gradient images, and combining the edge information for the sparse-gradient images with the reduced number of Fourier transform measurements to obtain the exact or stable reconstruction of the target images, thereby permitting improved temporal resolution and/or extent of tissue coverage over the use of full sampling and conventional image reconstruction methods.

27 Claims, 16 Drawing Sheets

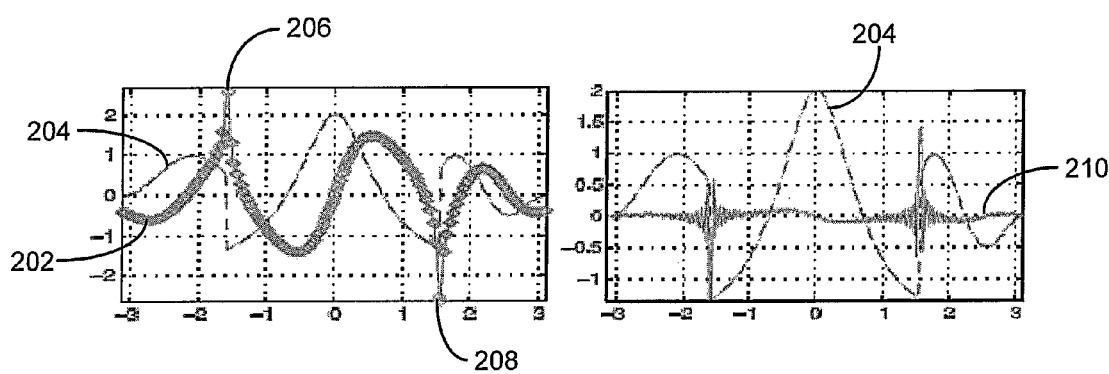
*Fig. 2a*          *Fig. 2b*
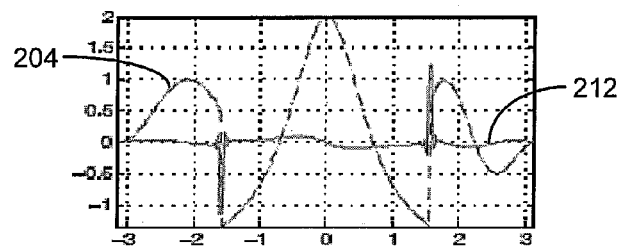
*Fig. 2c*

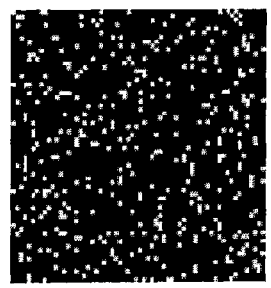
Fig. 6
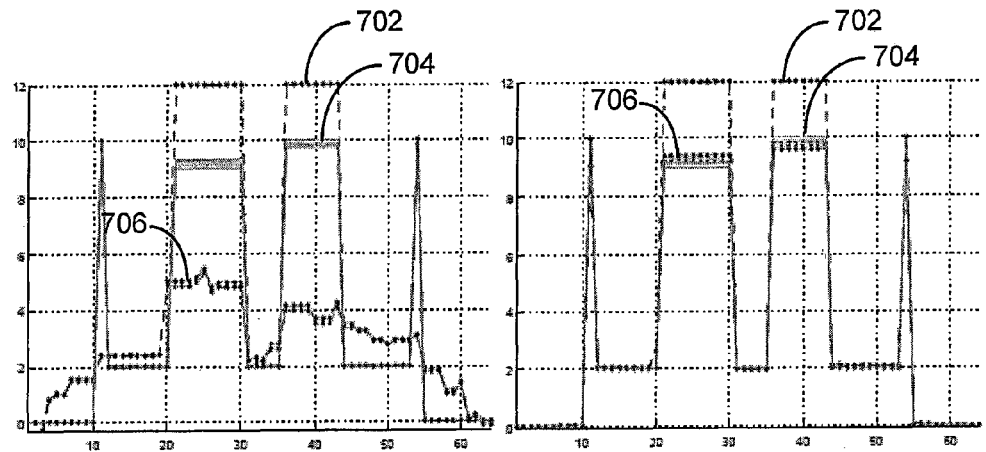
Fig. 7a　　　　　　　Fig. 7b

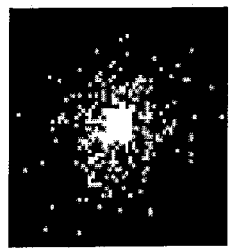
Fig. 8
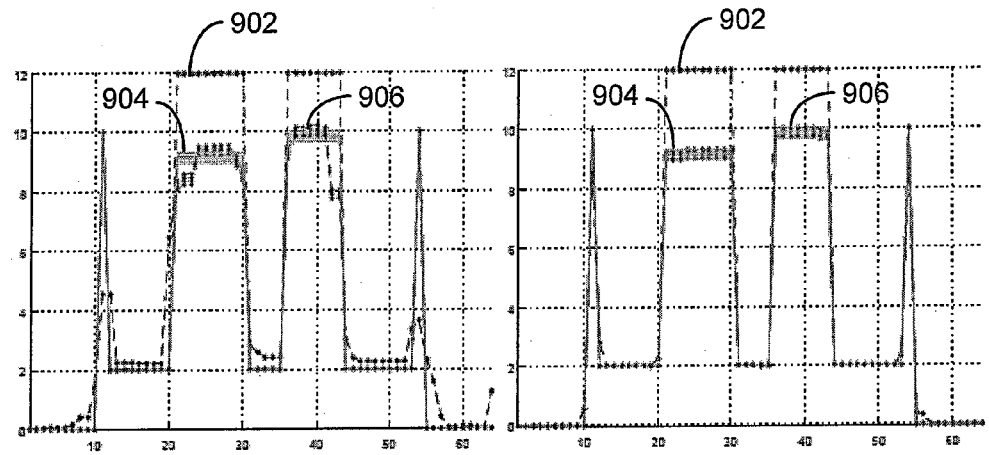
Fig. 9a  Fig. 9b

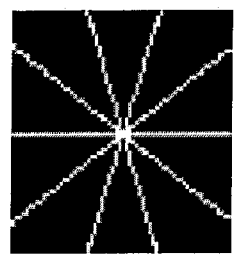
Fig. 10
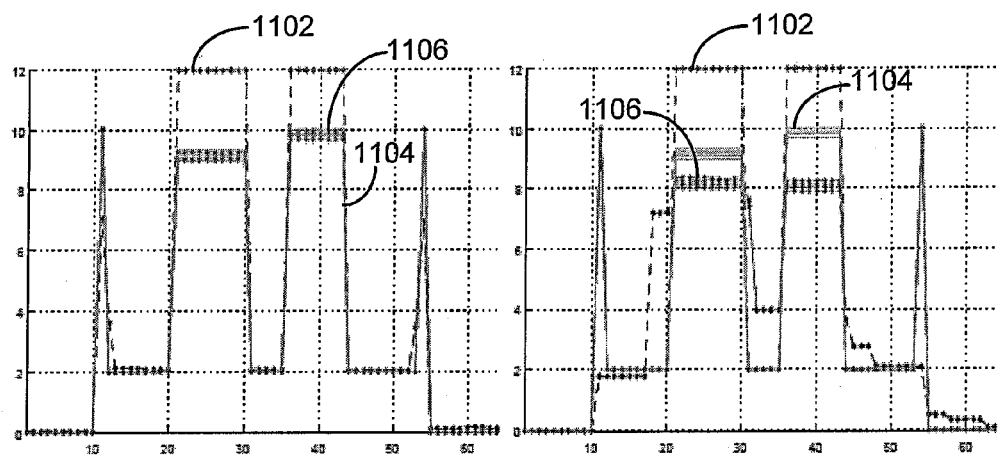
Fig. 11a      Fig. 11b

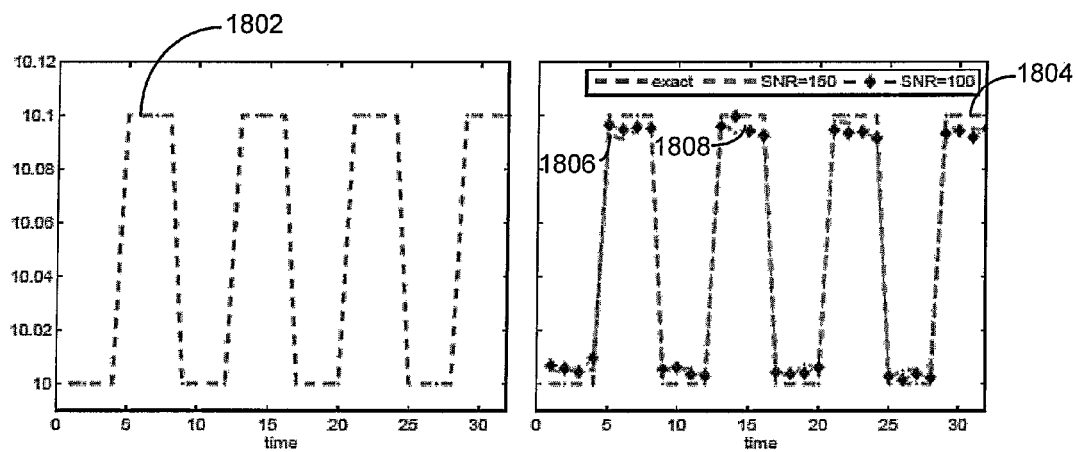
*Fig. 18a*  *Fig. 18b*

IMAGE RECONSTRUCTION FROM INCOMPLETE FOURIER MEASUREMENTS AND PRIOR EDGE INFORMATION

CROSS REFERENCE TO RELATED APPLICATIONS

This patent application claims benefit of the priority of U.S. Provisional Patent Application No. 61/673,936 filed Jul. 20, 2012 entitled SPARSE GRADIENT IMAGE RECONSTRUCTION FROM INCOMPLETE FOURIER MEASUREMENTS AND PRIOR EDGE INFORMATION.

GOVERNMENT SUPPORT

This invention was made with government support under Grant Number FA9550-07-1-0544 awarded by USAF/AFOSR. The government has certain rights in the invention.

FIELD OF THE INVENTION

The present application relates generally to imaging systems such as Magnetic Resonance Imaging (MRI) systems and functional MRI (fMRI) systems, and more specifically to systems and methods of image reconstruction that employ a reduced set of Fourier transform measurements in conjunction with prior edge information obtained from a reference image.

BACKGROUND

MRI is an imaging modality that is widely used to visualize soft tissue structures, such as brain tissue structures, muscle tissue structures, heart tissue structures, etc. Due to its capability of using contrast weightings based on physiological functions, traditional MRI has led to the development of fMRI, which requires the acquisition of time series information, i.e., a set of images of a region of interest acquired at different time points. An important consideration in fMRI is the total scan time required to obtain an accurate representation of the region of interest, which, in turn, determines the temporal resolution of the time series information. The temporal resolution must be adequate for accurately rendering time-varying properties of the region of interest, such as changes in local blood flow and/or oxygenation. For a conventional fMRI imaging system, the temporal resolution is typically in the range of about 2 to 2.5 seconds for whole-brain coverage. Thus, for fMRI, an increase in the temporal resolution would be desirable. Because fMRI techniques typically acquire a set of Fourier transform measurements for use in image reconstruction, one possible way of increasing the temporal resolution of fMRI is to reduce the amount of Fourier transform information obtained for each image in the time series.

One technique for reducing the amount of Fourier transform information obtained for image reconstruction is based on the known theory of Compressed Sensing (CS). Using CS, images can be accurately reconstructed from a set of incomplete, possibly random, Fourier transform measurements. The Fourier transform measurements are regarded as being incomplete in the sense that a discrete Fourier transform (DFT) of the Fourier transform measurements does not accurately recover the images. The known Nyquist-Shannon sampling theorem specifies that, in order to reconstruct an image with high accuracy, it is necessary to acquire the same number of Fourier transform measurements as the spatial resolution of the image. However, using CS, accurate image reconstruction can be achieved by obtaining fewer Fourier transform measurements than the number specified by the Nyquist-Shannon sampling theorem.

SUMMARY

In accordance with the present application, systems and methods of image acquisition and reconstruction are disclosed that can further reduce the amount of Fourier transform information required to obtain an exact or stable reconstruction of a time series of target images, using prior edge information (also referred to herein as "Fourier edge information") obtained from a reference image. As employed herein, the Fourier edge information from the reference image refers to the indices for which gradients of the reference image are substantially non-zero, as well as the corresponding gradient magnitudes. The reference image itself need not be acquired at the same time as the time series of target images. Rather, 2-dimensional (2-D) or 3-dimensional (3-D) Fourier transform measurements of the reference image, fully sampled for a region of interest, may be obtained. The 2-D (or 3-D) Fourier transform measurements of the full-sampled reference image can be obtained prior to performing a functional Magnetic Resonance Imaging (fMRI) time series study, and can be used, for example, for grey/white matter segmentation. Based on the full-sampled reference image sharing similar edge information with a time series of sparse-gradient images, the number of Fourier transform measurements required to reconstruct the time series of target images can be reduced by using Compressed Sensing (CS) techniques to obtain the sparse-gradient images, and combining the edge information for the sparse-gradient images with the reduced number of Fourier transform measurements to obtain the exact or stable reconstruction of the time series of target images.

In one aspect, a computer-implemented method of reconstructing a time series of target images acquired by an imaging system includes obtaining 2-D (or 3-D) Fourier transform measurements of a full-sampled reference image of a region of interest, and extracting Fourier edge information from the 2-D (or 3-D) Fourier transform measurements of the reference image. A reduced set of possibly random Fourier transform measurements are obtained of the time series of target images, and, using CS techniques, a time series of sparse-gradient images is obtained from the reduced set of Fourier transform measurements. Using the Fourier edge information from the reference image, approximate edge information is obtained for the time series of sparse-gradient images. By combining the approximate edge information for the sparse-gradient images with the reduced set of Fourier transform measurements, an exact or stable reconstruction of the target images can be achieved.

Other features, functions, and aspects of the invention will be evident from the Detailed Description that follows.

BRIEF DESCRIPTION OF THE DRAWINGS

The invention will be more fully understood with reference to the following Detailed Description in conjunction with the Drawings of which:

FIG. 2a is a diagram illustrating an exemplary piecewise smooth function, and the conjugate partial sum of the piecewise smooth function with multiple jumps;

FIG. 2b is a diagram illustrating the piecewise smooth function of FIG. 2a, and the generalized conjugate partial sum of the piecewise smooth function with a $1^{st}$-degree polynomial concentration factor;

FIG. 2c is a diagram illustrating the piecewise smooth function of FIG. 2a, and the generalized conjugate partial sum of FIG. 2b, following filtering by an exponential filter;

FIG. 6 illustrates a random Fourier domain sampling pattern with uniform sampling density;

FIGS. 7a and 7b are diagrams illustrating, in the form of intensity profiles, edge information for a time series of images, prior edge information from a reference image, and edge information for a reconstruction of the time series of images, with uniform sampling density;

FIG. 8 illustrates a Fourier domain sampling pattern with Gaussian sampling density;

FIGS. 9a and 9b are diagrams illustrating edge information for a time series of images, prior edge information from a reference image, and edge information for a reconstruction of the time series of images, with Gaussian sampling density;

FIG. 10 illustrates a Fourier domain sampling pattern with radial sampling;

FIGS. 11a and 11b are diagrams illustrating, in the form of intensity profiles, edge information for a time series of images, prior edge information from a reference image, and edge information for a reconstruction of the time series of images, with radial sampling;

FIG. 17b depicts a close-up of the edge information for a center ellipse illustrated in FIG. 17a;

FIG. 18a is a diagram illustrating center ellipse intensities for an iso-intense time series of images, prior to the addition of simulated measurement noise;

FIG. 18b is a diagram illustrating ellipse intensities for the reconstruction of the time series of images of FIG. 18a, in the presence of measurement noise.

DETAILED DESCRIPTION

The disclosure of U.S. Provisional Patent Application No. 61/673,936 filed Jul. 20, 2012 entitled SPARSE GRADIENT IMAGE RECONSTRUCTION FROM INCOMPLETE FOURIER MEASUREMENTS AND PRIOR EDGE INFORMATION is incorporated herein by reference in its entirety.

Systems and methods of image acquisition and reconstruction are disclosed that can reduce the number of Fourier transform measurements required to obtain an exact or stable reconstruction of a time series of target images, using prior edge information (also referred to herein as "Fourier edge information") obtained from a reference image. 2-dimensional (2-D) or 3-dimensional (3-D) Fourier transform measurements are obtained of the reference image, fully sampled for a region of interest, prior to performing a functional Magnetic Resonance Imaging (fMRI) time series study. Based on the full-sampled reference image sharing similar edge information with a time series of sparse-gradient images, the number of Fourier transform measurements required to reconstruct the time series of target images can be reduced by using Compressed Sensing (CS) techniques to obtain the sparse-gradient images, and combining the edge information for the sparse-gradient images with the reduced number of Fourier transform measurements to obtain the exact or stable reconstruction of the target images.

In imaging applications such as fMRI, 2-D (or 3-D) Fourier transform measurements of a full-sampled time series of target images of a region of interest are typically required to reconstruct the target images. In order to reduce the total scan time and increase the temporal resolution of fMRI, it would be desirable to accurately reconstruct the target images from the smallest possible set of Fourier transform measurements. CS techniques have provided the capability of accurately reconstructing images that exhibit sparsity in a particular domain (e.g., the gradient domain, the Fourier domain, the wavelet domain, etc.) from a reduced set of Fourier transform measurements. For example, if such images exhibit sparsity with respect to their gradient (such images are referred to herein as "sparse-gradient images"), then total-variation (TV)

minimization techniques can be used to reconstruct the sparse-gradient images from the reduced set of Fourier transform measurements. To further reduce the number of Fourier transform measurements required for accurate image reconstruction, approximate edge information for the sparse-gradient images can be obtained from the Fourier edge information for the reference image. By combining the approximate edge information for the sparse-gradient images with the reduced set of Fourier transform measurements, the number of Fourier transform measurements required for exact or stable reconstruction of the target images can be decreased by at least a factor of about 1.6 to 3, as compared with using CS techniques without such edge information.

Figure 1:
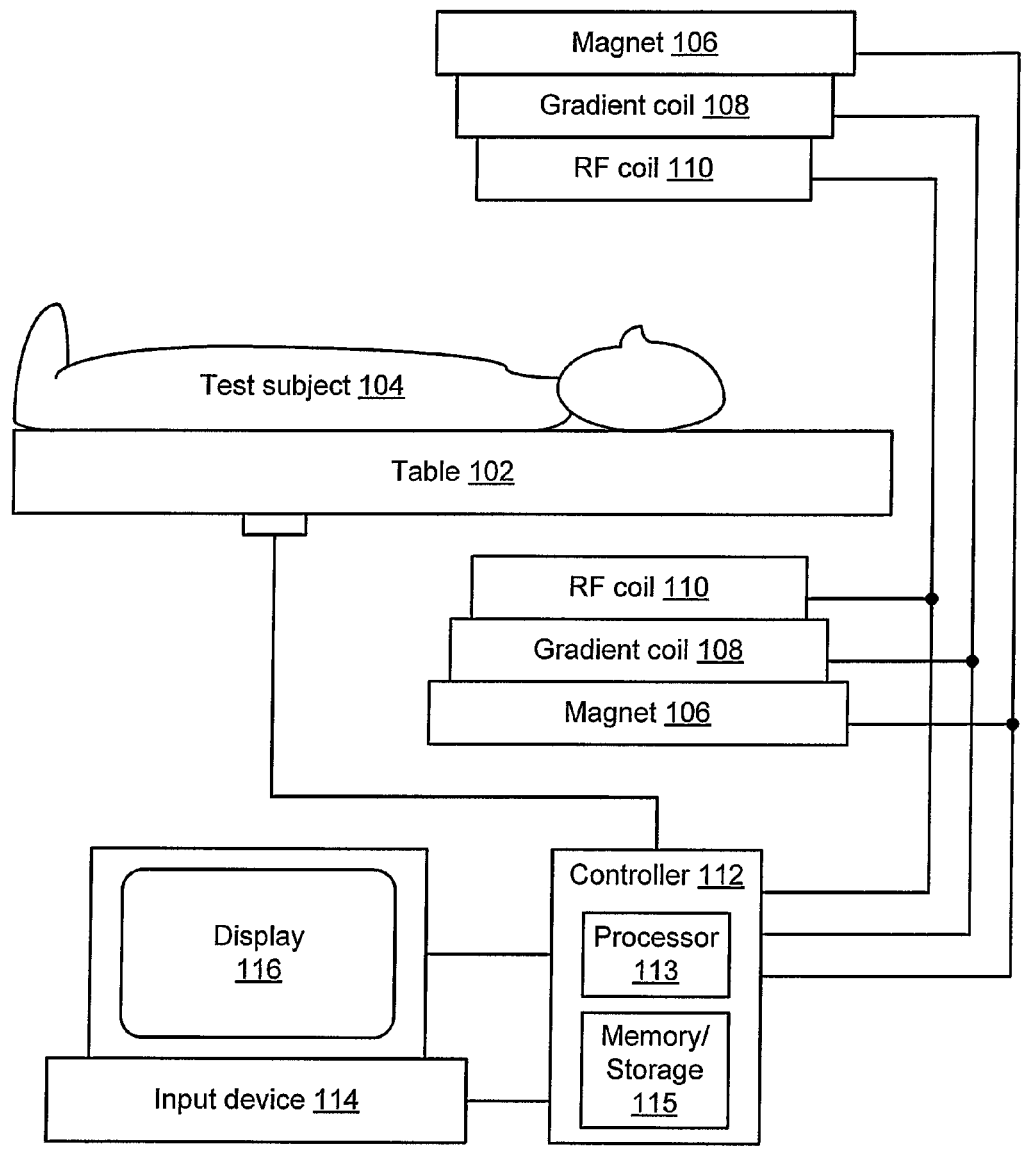
FIG. 1 is a block diagram of an exemplary imaging system that can be configured to employ an embodiment of the present application.

FIG. 1 depicts an exemplary imaging system 100, such as an fMRI imaging system, which can be configured to perform the disclosed methods of image acquisition and reconstruction that employ Fourier edge information obtained from a reference image. It is noted that such image reconstruction can also be performed away from the imaging system by exporting the raw Fourier data to another computer. As shown in FIG. 1, the imaging system 100 includes a table 102 upon which a test subject 104 may recline. The imaging system 100 further includes a magnet 106 for producing a magnetic field, a gradient coil 108 for producing a gradient field, and a radio frequency (RF) coil 110 for producing an RF field. The magnetic field produced by the magnet 106 is operative to align the magnetization of atomic nuclei in a region of interest within the test subject 104, and the RF field produced by the RF coil 110 is operative to systematically alter the magnetization alignment, causing the atomic nuclei in the region of interest to produce a rotating magnetic field. The RF coil 110 detects the rotating magnetic field, which the imaging system 100 subsequently uses to reconstruct reference and time series images of the region of interest. The gradient coil 108 can produce the gradient field in different directions to allow the imaging system 100 to obtain the time series of target images in any arbitrary orientation. The imaging system 100 also includes a controller 112, including a microprocessor or microcontroller 113 and its associated memory and/or storage device(s) 115. The controller 112 is operative to control the various components of the imaging system 100, in accordance with the disclosed methods of image acquisition and reconstruction. A human operator may control the controller 112 via an input device 114, such as a keyboard or mouse, to select and/or customize a desired imaging sequence. The operator may also view the reconstructed time series of target images on a display 116.

In the following detailed description, Section I (Setup and Problem Formulation) provides a discussion of sparse-gradient images, as well as an introduction to the problem of accurately reconstructing a time series of target images from a reduced set of Fourier transform measurements. Section II (Sparse Reconstruction from Fourier Measurements) provides an overview of CS techniques, as applied to sparse-gradient images. Section III (Edge Detection in Fourier Data) provides a discussion of how edge detection can be performed using a set of Fourier transform measurements, as well as an explanation of how Fourier edge information can be obtained from a reference image. Section IV (Combining Fourier and Edge Data) provides a discussion of how the CS techniques for sparse-gradient images can be combined with the Fourier edge information from the reference image to accurately reconstruct the time series of target images from the reduced set of Fourier transform measurements. Section V (Numerical Examples) provides several illustrative numerical examples of reconstructing a time series of target images from a reduced set of Fourier transform measurements, using Fourier edge information obtained from a reference image.

SECTION I: SETUP AND PROBLEM FORMULATION

Consider an exemplary 2-D target image, $X \in C^{N \times N}$, and an exemplary 2-D reference image, $Y \in C^{N \times N}$ for which there is full discrete Fourier transform (DFT) information, $\hat{Y} \in C^{N \times N}$. It is assumed that the spatial resolution of the target image, X, is the same as the spatial resolution of the reference image, Y. The individual pixels of the target image, X, are referred to herein as $X_{i,j}$. Horizontal and vertical differencing matrices can be defined as follows, $$(D_h X)_{i,j} := \begin{cases} X_{i+1,j} - X_{i,j}, & i < N \\ 0, & i = N \end{cases} \quad (1)$$

$$(D_v X)_{i,j} := \begin{cases} X_{i,j+1} - X_{i,j}, & j < N \\ 0, & j = N. \end{cases} \quad (2)$$

Further, a discrete gradient operator can be defined as follows, $$(DX)_{i,j} = \begin{pmatrix} (D_h X)_{i,j} \\ (D_v X)_{i,j} \end{pmatrix}, \quad (3)$$

in which $DX \in C^{N \times N \times 2}$. Moreover, discrete isotropic and anisotropic total-variation (TV) operators can be defined as follows, $$(TV_{iso}(X))_{i,j} \stackrel{\circ}{=} \sqrt{|(D_h X)_{i,j}|^2 + |(D_v X)_{i,j}|^2} \quad (4)$$

$$(TV_{aniso}(X))_{i,j} \stackrel{\circ}{=} |(D_h X)_{i,j}| + |(D_v X)_{i,j}|, \quad (5)$$

in which $TV_{iso}(X) \in C^{N \times N}$ and $TV_{aniso}(X) \in C^{N \times N}$. In addition, an $l_p$-norm can be defined as follows, $$\|X\|_p = \left( \sum_{i=1}^{N} \sum_{j=1}^{N} |X_{i,j}|^p \right)^{\frac{1}{p}} \quad (6)$$

for $0 < p < \infty$. For $p = 0$, a quasi-norm can also be defined as follows, $$\|X\|_0 = \{\#(i,j): X_{i,j} \neq 0\}. \quad (7)$$

The quasi-norm effectively counts the number of non-zero elements in the target image, X. Isotropic and anisotropic TV quasi-norms can further be defined as follows, $$\|X\|_{TV_{iso}} \stackrel{\circ}{=} \|TV_{iso}(X)\|_1 \quad (8)$$

$$\|X\|_{TV_{aniso}} \stackrel{\circ}{=} \|TV_{aniso}(X)\|_1. \quad (9)$$

It is noted that the target image, X, is referred to herein as being "K-sparse" if it contains at most K non-zero entries, i.e., $\|X\|_0 = K$. Further, the target image, X, is referred to herein as being K-sparse in total-variation (TV) or gradient if $\|TV_{ISO}(X)\|_0 = K$ in the isotropic discretization form, or $\|TV_{aniso}(X)\|_0 = K$ for the anisotropic discretization form. The following detailed description will consider the anisotropic form. However, it should be understood that the detailed description below analogously applies to the isotropic form.

The problem of accurately reconstructing the target image, X, from a reduced set of Fourier transform measurements, can be formulated as recovering the target image, X, which is K-sparse in gradient, from m<<n Fourier transform measurements of the target image X, and Fourier edge information obtained from full discrete Fourier transform (DFT) information for the reference image, Y. The target image, X, that is K-sparse in gradient is also referred to herein as the "sparse-gradient image, X". In the following analysis, M 2-D frequencies, $(\omega_{1,k}, \omega_{2,k})$, are defined for $1 \le k \le m$, chosen according to a specified sampling pattern, such as a uniform sampling pattern, a Gaussian sampling pattern, a radial sampling pattern, a spiral sampling pattern, a rosette sampling pattern, an elliptical sampling pattern, a sampling pattern that combines characteristics of two or more of the foregoing sampling patterns, or any other suitable sampling pattern. Further, "F" denotes a normalized 1-dimensional (1-D) N×N DFT matrix, and "$F^{-1}$" denotes its inverse, in which $$F_{i,j} = \frac{1}{\sqrt{N}} e^{2\pi(i-1)(j-1)/N} \qquad (10)$$

$$i,j = 1, \ldots, N.$$

In addition, "$\hat{F}$" denotes a 2-D DFT, and "$\hat{F}^{-1}$" denotes its inverse. It is noted that the operator, $\hat{F}$, can be expressed in terms of F as follows, $$\hat{F}X = FXF. \qquad (11)$$

A restricted 2-D Fourier operator can also be defined as follows, $$\hat{F}_\Omega : C^{N \times N} \to C^m, \qquad (12)$$

in which $$(\hat{F}_\Omega X)_k = (\hat{F}X)_{(\omega_{1,k}, \omega_{2,k})}. \qquad (13)$$

For the reference image, Y, the edge (also referred to herein as the "jump") locations refer to the pixels or indices for which $TV_{aniso}(Y)$ is nonzero, and the edge (or jump) magnitudes refer to the corresponding value of $TV_{aniso}(Y)$ at those jump locations. The Fourier edge information from the reference image, Y, refers to the collection of jump locations and their corresponding jump magnitudes. Because, as described herein, the Fourier transform information for the reference image, Y, can be obtained instead of obtaining the reference image, Y, itself, the theory of edge detection from Fourier transform measurements can be used to obtain the required Fourier edge information from the reference image.

The problem of reconstructing the target image, X, can now reformulated, as follows. Consider a set, $\Omega$, of m<<n Fourier transform measurements, $\hat{F}_\Omega X$, of the target image, X, and Fourier edge information for the reference image, Y, obtained from the 2-D Fourier transform information, $\hat{Y} = \hat{F}Y$. In the following analysis, it is assumed that the reference image, Y, and the sparse-gradient image, X, exhibit similar edge information. The target image, X, can be recovered from fewer Fourier transform measurements than Compressed Sensing (CS) techniques alone would typically allow, using the Fourier edge information for the reference image, Y. In other words, the number, m, of Fourier transform measurements, $\hat{F}_\Omega X$, required to reconstruct the target image, X, can be reduced, using the Fourier edge information for the reference image, Y.

Section II: SPARSE RECONSTRUCTION FROM FOURIER MEASUREMENTS

In Section II, an overview of the theory of Compressed Sensing (CS) is provided for reconstructing total-variation (TV) or sparse-gradient images from incomplete Fourier transform measurements. The target image, X, with Fourier transform measurements, $F_\Omega X$, can be recovered using CS with an $l_1$ total-variation (TV) minimization technique, as follows, $$X^* = \arg \min_Z \|TV_{aniso}(Z)\|_1, \qquad (14)$$

subject to $\hat{F}_\Omega Y = \hat{F}_\Omega X$. If the target image, X, is real-valued and K-sparse in the TV or gradient domain (i.e., the target image, X, is a sparse-gradient image, X), and, if $m \ge CK \log^4 (N)$ and the Fourier transform measurements are chosen uniformly at random, then the solution to equation (14) is unique and equal to the target image, X, with a probability of about $1 - N^{-\gamma \log^3(N)}$. It is noted that "C" and "$\gamma$" are universal constants greater than 1 that do not depend upon "m" or "N".

If the Fourier transform measurements of the target image, X, contain noise, i.e., $$y = \hat{F}_\Omega X + \eta. \qquad (15)$$

in which "$\eta$" represents the measurement noise with $\|\eta\|_2 = \epsilon$ and $y \in C^m$, then the target image, X, can be recovered using the $l_1$ TV minimization technique, as follows, $$X_\eta^* = \arg \min_Z \|TV_{aniso}(Z)\|_1, \qquad (16)$$

subject to $\|\hat{F}_\Omega X - b\|_2 \le \epsilon$. It is noted that the solution to equation (16) satisfies $\|X - X_\eta^*\|_2 \le C_1 \eta$, in which "C" is dependent upon the number of Fourier transform measurements.

Using an unconstrained optimization approach, equations (14) and (16) can be solved as follows, $$X_\lambda^* = \arg \min_Z \lambda \|TV_{aniso}(Z)\|_1 + \|\hat{F}_\Omega X - b\|_2^2, \qquad (17)$$

in which "$\lambda$" is a penalization parameter that is greater than or equal to zero. The penalization parameter, $\lambda$, can be chosen to be small enough so that $\|\hat{F}_\Omega X - b\|_2 \le \epsilon$ in the noisy case. It is noted that, in the noiseless case, $\lim_{\lambda \to 0} X_\lambda^* = X^*$.

SECTION III: EDGE DETECTION IN FOURIER DATA

Consider an exemplary $2\pi$ periodic and piecewise smooth function, $f(x)$, on the interval $[0, 2\pi)$, with a single jump at $x = \xi$ is assumed that a one-sided $p^{th}$ derivative of $f(x)$ exists at $x = \xi$ for $m \ge 1$. It is noted that piecewise constant functions generally satisfy this assumption. The jump of the function, $f(x)$, can be defined as follows, $$[f](x) := f(x^+) - f(x^-), \qquad (18)$$

in which "$f(x^+)$" and "$f(x^-)$" are the right and left limits, respectively, of the function, $f(x)$, at x. The Fourier coefficients of the function, $f(x)$, can be expressed as follows, $$\hat{f}_k = \frac{1}{2\pi} \int_0^{2\pi} f(x)\varepsilon^{-ikx}\,dx \quad (19)$$

for k=−N, . . . , N. One approach to detecting edges (jumps) from the Fourier coefficients of equation (19) is based on evaluating a conjugate Fourier partial sum of the form, $$-\frac{\pi}{\log(N)}\overline{S}_N[f](x) = -\frac{i\pi}{\log(N)}\sum_{k=-N}^{N}\operatorname{sgn}(k)\hat{f}_k e^{ikx}, \quad (20)$$

in which "sgn" denotes the "signum" function. It is noted that the term

"$-\frac{\pi}{\log(N)}\overline{S}_N[f](x)$"

converges to "[f](x)" at a rate of O(1/log(N)). To speed up the convergence, a generalized conjugate Fourier sum may be employed, as follows, $$\overline{S}_N^\sigma[f](x) = i\sum_{k=-N}^{N}\operatorname{sgn}(k)\sigma\left(\frac{|k|}{N}\right)\hat{f}_k e^{ikx}, \quad (21)$$

in which $$\sigma(\eta) = \sigma\left(\frac{|k|}{N}\right),$$

η∈(0,1], is referred to herein as a "concentration factor". The generalized conjugate Fourier sum of equation (21) converges faster than the conjugate Fourier partial sum of equation (20). For example, for a 1$^{st}$-degree polynomial concentration factor σ(x)=−πx, or $$\sigma_{k,N} \equiv -\frac{\pi k}{N},$$

$$\overline{S}_N^\sigma[f](x) \stackrel{N\to\infty}{\to} [f](x), \quad (22)$$

which converges at a rate of $$O\left(\frac{\log(N)}{N}\right).$$

It is noted that, in the discrete case, spurious oscillations may appear, as illustrated in FIGS. 2a and 2b. FIG. 2a depicts the function, ƒ(x) 204, as well as the conjugate partial sum 202 of the function, ƒ(x) 204, with two jumps 206, 208. FIG. 2b depicts the function, ƒ(x) 204, as well as the generalized conjugate partial sum 210 of the function, ƒ(x) 204, with a 1$^{st}$-degree polynomial concentration factor. It is noted that filtering may be employed to dampen the spurious oscillations, using, for example, an exponential filter of the form, $$\sigma^{filt}(\eta) = \begin{cases} 1, & |\eta| \le \eta_c \\ \exp\left(-\alpha\left(\frac{\eta-\eta_c}{1-\eta_c}\right)^p\right), & \eta > \eta_c, \end{cases} \quad (23)$$

in which η∈(0,1], "α" is a measure of how much the higher modes should be filtered, and "p" is the order of the filter. With the addition of the exponential filter of equation (23), the generalized conjugate partial sum can take the form, $$\overline{S}_N^\sigma[f](x) = i\sum_{k=-N}^{N}\operatorname{sgn}(k)\sigma\left(\frac{|k|}{N}\right)\sigma^{filt}\left(\frac{|k|}{N}\right)\hat{f}_k e^{ikx}. \quad (24)$$

FIG. 2c depicts the function, ƒ(x) 204, as well as the generalized conjugate partial sum 212 with the addition of the exponential filter (see equation 23). As shown in FIG. 2c (5), the spurious oscillations are substantially eliminated.

For a signal, x∈C$^N$, an edge matrix, E∈C$^{N\times N}$, can be defined to be the discrete analog of $\overline{S}_N^\sigma$. For example, the edge matrix, E, may take the form, $$E := F^{-1}\sum F, \quad (25)$$

in which $$\sum := diag\left(\frac{1}{\log(N/2)}i\operatorname{sgn}(\overline{k})\sigma\left(\frac{2|\overline{k}|}{N}\right)\sigma^{filt}\left(\frac{2|\overline{k}|}{N}\right)\right), \quad (26)$$

$$\overline{k} := \left(0, \ldots, \frac{N}{2}, -\frac{N}{2}+1, \ldots, -1\right)$$

is a diagonal N×N complex-valued matrix, and F∈C$^{N\times N}$ is the 1-D discrete Fourier matrix.

The target image, X, contains edge information in both the horizontal and vertical directions. The edge matrix, E, can therefore be applied along the rows and columns of the target image, X. A 2-D edge detection operator can be defined as follows, $$\varepsilon X := \begin{pmatrix} EX \\ XE^T \end{pmatrix}, \quad (27)$$

in which EX∈C$^{N\times N}$, XE$^T$∈C$^{N\times N}$, and εX∈C$^{2N\times N}$. An edge detection operator, which applies to the 2-D Fourier transform information, Ŷ, can also be defined as follows, $$\hat{\varepsilon}\hat{Y} := \begin{pmatrix} \hat{E}\hat{Y}F^{-1} \\ F^{-1}\hat{Y}\hat{E}^T \end{pmatrix}, \quad (28)$$

in which Ê:=F$^{-1}$Σ, ÊŶF$^{-1}$∈C$^{N\times N}$, F$^{-1}$ŶÊ$^T$∈C$^{N\times N}$, and $\hat{\varepsilon}\hat{Y}$∈C$^{2N\times N}$.

It is noted that not all of the edge information obtained using the edge detection operator, $\hat{\varepsilon}\hat{Y}$, (such edge information is also referred to herein as the "Fourier edge information, $\hat{\varepsilon}\hat{Y}$") is required, just the edge information relating to the jump locations. To determine the Fourier edge information, $\hat{\varepsilon}\hat{Y}$, relating to the jump locations, a threshold parameter, τ>0, can be introduced, and the indices in the Fourier edge information, $\hat{\varepsilon}\hat{Y}$, for which the pixel values surpass the threshold parameter, τ, can be determined. The threshold parameter, τ, can be empirically determined so that it is small enough to capture the most relevant jumps. After computing the Fourier edge information, $\hat{\epsilon}\hat{Y}$, the indices for which the pixel values are larger in absolute magnitude than the threshold parameter, τ, can be determined. More specifically, a set, $\Omega_\tau$, of indices for reconstruction can be defined as follows, $$\Omega_\tau := \begin{cases} (i,j): |(\hat{\epsilon}\hat{Y})_{i,j}| \geq \tau, \\ 1 \leq i \leq 2N, 1 \leq N, \end{cases} \quad (29)$$

in which $m_\tau := \|\Omega_\tau\|$ is the cardinality of the set, $\Omega_\tau$. For example, the set, $\Omega_\tau$, can be defined to be the set of $m_\tau$ pairs $(i_k,j_k)\in\Omega_\tau$ for $1\leq k\leq m_\tau$. Restricted edge detection operators, $\epsilon_{\Omega_\tau}:C^{N\times N}\rightarrow C^{m_\tau}$ and $\hat{\epsilon}_{\Omega_\tau}:C^{N\times N}\rightarrow C^{m_\Omega}$ can also be defined, in which $$(\epsilon_{\Omega_\tau}X)_k = (\epsilon X)_{i_k,j_k} \quad (30)$$

$$(\hat{\epsilon}_{\Omega_\tau}\hat{Y})_k = (\hat{\epsilon}\hat{Y})_{i_k,j_k} \quad (31)$$

SECTION IV: COMBINING TIME SERIES FOURIER AND EDGE DATA

The problem of accurately reconstructing the target image, X, from m<<n Fourier transform measurements, $\hat{F}_\Omega X$, and the Fourier edge information, $\hat{\epsilon}_{\Omega_\tau}\hat{Y}$, can be solved as follows. The "m" Fourier transform measurements can be denoted as $y=\hat{F}_\Omega X$, and the "$m_\tau$" edge measurements can be denoted as $y_e=\hat{\epsilon}_{\Omega_\tau}\hat{Y}$. Consider the set, $\Omega$, of m<<n Fourier transform measurements, y, of the target image, X, and the set, $\Omega_\tau$, of $m_\tau$ edge measurements, $y_e$. It is assumed that the reference image, Y, and the sparse-gradient image, X, exhibit similar edge information. The target image, X, can then be recovered by solving an $l_1$ image regularization problem, as follows, $$X^*_{\lambda,\gamma} = \arg\min_{Z\in C^{N\times N}} \lambda\|TV_{aniso}(Z)\|_1 + \|\hat{F}_\Omega X - y\|_2^2 + \gamma\|\epsilon_{\Omega_\tau}X - y_e\|_2^2 \quad (32)$$

in which the square error term, $\gamma\|\hat{\epsilon}_{\Omega_\tau}X-y_e\|_2^2$, incorporates the Fourier edge information, and "λ" and "γ" are positive scalars for balancing the image regularization and edge data fidelity. It is noted that, if y=0, then equation (32) corresponds to the unconstrained optimization approach of equation (17). Further, if λ=γ=0, then equation (32) corresponds to the least squares solution. At a cost of slightly higher sparsity than the isotropic TV discretization approach, equation (32) tends to converge more quickly to the desired solution. In order to solve equation (32), a non-linear conjugate gradient technique can be employed with gradient restarts. It is further noted that, because the $l_1$-norm is non-differentiable at zero, a smoothing parameter, μ, can be introduced, and the $l_1$ total-variation (TV) minimization technique of equation (14) can be approximated as follows, $$\|X\|_1 \approx \sum_{i=1}^{N}\sum_{j=1}^{N}\sqrt{X_{i,j}+\mu}. \quad (33)$$

The smoothing parameter can be $\mu\in[10^{-12},10^{-10}]$, or any other suitable value. Further, the positive scalars, λ and γ, can each be equal to about 0.01, or any other suitable values.

In the foregoing analysis, it was assumed that the spatial resolution of the reference image, Y, is about the same as the spatial resolution of the target image, X. If the spatial resolution of the reference image, Y, is higher than that of the target image, X, i.e., $\hat{Y}\in C^{N_2\times N_2}$, $N_2>N$, then the Fourier edge information, $\hat{\epsilon}\hat{Y}\in C^{2N_2\times N_2}$, can be applied to the lower resolution image, X, by performing a bilinear interpolation on the Fourier edge information, $\hat{\epsilon}\hat{Y}\in C^{2N_2\times N_2}$ to obtain lower resolution edge measurements, $\hat{I}_N(\epsilon_H\hat{Y})\in C^{2N\times N}$. The bilinear interpolation can be performed, as follows. Consider a high-resolution operator, $\epsilon_H:C^{N_H\times N_H}\rightarrow C^{2N_H\times N_H}$, and a low-resolution operator, $\epsilon:C^{N\times N}\rightarrow C^{2N\times N}$, in which $N_H>N$. To determine the approximate edge measurements for the lower resolution image, X, the bilinear interpolation can be performed on the edge information, $\epsilon_H\hat{Y}$. A high-resolution 1-D point grid can be defined as $$x_j = \frac{j}{N_H},$$

$j=1,\ldots,N_H$. Similarly, a low-resolution 1-D point grid can be defined as $$\bar{x}_j = \frac{j}{N},$$

$j=1,\ldots,N$. The $i^{th}$ row of the edge information, $\epsilon_H\hat{Y}$, is denoted as $\{f_{i,j}\}_{j=1}^{N_H}$. The pairs $\{(x_j,f_{i,j})\}_{j=1}^{N_H}$ can then be interpreted as discrete samples of a 1-D function, $f_i(x)$, at the higher resolution grid points, $\{x_j\}_{j=1}^{N}$. A linear interpolation of $f_i(x)$ can then be performed at the lower resolution grid points, $\{\bar{x}_j\}_{j=1}^{N}$, along each row. For each column, an analogous linear interpolation can be performed on the first $N_H$ rows, and on the last $N_H$ rows separately. Each row of the edge information, $\epsilon_H\hat{Y}$, is of length, $2N_H$. Once the bilinear interpolation is completed, the lower resolution edge measurements, $\hat{I}_N(\epsilon_H\hat{Y})\in C^{2N\times N}$ are provided on the low-resolution grid. The term, $y_e$, can then be determined in equation (32) by replacing the term, $\hat{\epsilon}\hat{Y}$, in equation (29) with the lower resolution edge measurements, $\hat{I}_N(\epsilon_H\hat{Y})$.

One consequence of using higher resolution Fourier edge data is that the approximate locations of the edges (jumps) in the sparse-gradient images, X, as determined by the Fourier edge information from the reference image, Y, may no longer be exact. However, by introducing iteratively adapted weights to the total-variation (TV) $l_1$ term in equation (32), an accurate reconstruction of the target image, X, can be achieved. The adapted weights can be iteratively determined by detecting the jumps in the reconstructed images, $X^{(k)}(w)$ (see equation (34)). Wherever the jumps are detected, the weights can be reset to zero, and subsequently set to the appropriate non-zero values. Specifically, an iteration number, k, can be set to 1, a plurality of weights, $w_i$, can be set to 1 for i=1, . . . , n, and $X^{(0)}$ can be denoted as an "initial guess". The weighted TV minimization, with the respective weights, $w_i$, and the initial guess, $X^{(0)}$, can then be determined as follows, $$X^{(k)}(w) = \quad (34)$$

$$\arg\min_Z \sum_{i=1}^{n} w_i(|(D_hZ)_i|+|(D_vZ)_i|) + \|\hat{F}_\Omega X - y\|_2^2 + \gamma\|\epsilon_{\Omega_\tau}X - y_e\|_2^2.$$

Further, the jumps in the reconstructed image, $X^{(k)}(w)$, can be detected as follows, $$I^{(k)} = \{i:(D_hZ)_i|+|(D_vZ_i)>2^{-k}\max\{|(D_hZ)_i|+|(D_vZ)_i|\},$$
$$i=1,\ldots,N\}, \quad (35)$$

in which "$I^{(k)}$" is a set of indices for the detected jumps. The weights, $w_i$, can then be updated as follows, $w_i=0$ for all $i\in I^{(k)}$, and $w_j=1$ for all $j\notin I^{(k)}$. Moreover, the initial guess, $X^{(0)}$, can be set to $X^{(k)}$, k can be set to k+1, γ can be reset to zero, and the determination of the weighted TV minimization using equation (34), the detection of the jumps in the reconstructed image, $X^{(k)}(w)$, using equation (35), and the updating of the weights, $w_i, w_j$, can be repeated until predetermined stopping conditions are satisfied.

It is noted that, for k=1, equation (34) is equivalent to equation (32). Further, for k>1, equation (34) does not use the edge information from the reference image, Y, i.e., $\gamma=0$. Rather, equation (34) uses the edge information from the reconstructed image, $X^{(k)}(w)$, itself. It is further noted that convergence can typically be achieved using equation (34) after about four to six iterations.

SECTION V: NUMERICAL EXAMPLES

In Section V, three illustrative numerical examples are provided, including a first numerical example that illustrates the reconstruction of a time series of target images from incomplete Fourier transform measurements and prior (Fourier) edge information, using equation (32). In the first numerical example, uniform, Gaussian, and radial sampling patterns are employed, and the reference image, Y, provides substantially exact edge locations for the sparse-gradient images, X. A second numerical example illustrates the reconstruction of the same time series of target images, but with inexact edge measurements and a Gaussian sampling pattern for the Fourier transform measurements, using equation (34). Noise is also introduced into the measurements performed in the second numerical example. A third numerical example examines image reconstruction for a different time series under a Gaussian sampling pattern, inexact edge information, and noisy measurements. In the time series of target images used in the third numerical example, small changes can occur between the time points to simulate an actual time study more accurately. It is noted that the use of inexact edge information corresponds to the case in which the reference image dataset is acquired at higher spatial resolution than the time series images dataset.

Figure 3:
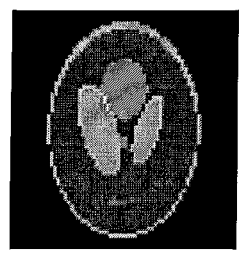
FIG. 3 illustrates an exemplary reference image.
Figure 4:
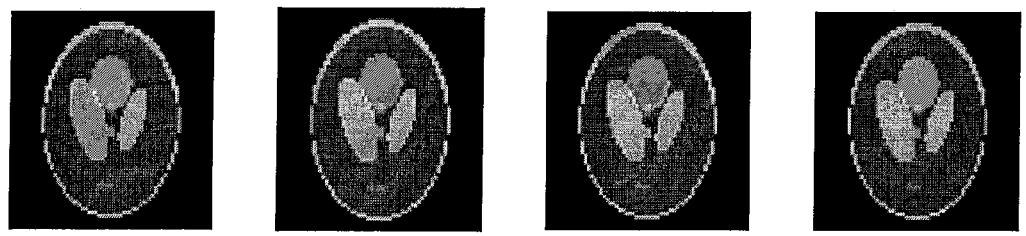
FIG. 4 illustrates an exemplary time series of images to be reconstructed using prior edge information from the reference image of FIG. 3.

The first numerical example examines the reconstruction of time series images, $\{X(t)\}_{t=1}^4$, $X(t) \in C^{64 \times 64}$, from incomplete Fourier transform measurements, and Fourier edge information extracted from 2-D Fourier transform information, $\hat{Y} \in C^{64 \times 64}$ for a reference image, $Y \in C^{64 \times 64}$. The reference image, Y, contains substantially the same jump locations as the time series images, $\{X(t)\}_{t=1}^4$. In this first numerical example, the time series images $\{X(t)\}_{t=1}^4$ are Shepp-Logan phantom images with ellipse intensities varying by about 1%. FIG. 3 depicts the reference image, Y, and FIG. 4 depicts the time series images $\{X(t)\}_{t=1}^4$ to be reconstructed using the Fourier edge information from the reference image, Y.

It is noted that the reference image, Y, and the time series images, $\{X(t)\}_{t=1}^4$, are essentially the same except for the intensities of center ellipses, $e_l(t) \in R$, $e_r(t) \in R$. Table I provides a comparison of the values of the center ellipses $e_l(t) \in R$, $e_r(t) \in R$, for the reference image, Y, as well as the time series images, $\{X(t)\}_{t=1}^4$.

TABLE I

| | $e_l(t)$ | $e_r(t)$ |
|---|---|---|
| $X_1$ | 9.0 | 10.0 |
| $X_2$ | 9.1 | 9.9 |
| $X_3$ | 9.2 | 9.8 |
| $X_4$ | 9.3 | 9.7 |
| Y | 12 | 12 |

In these illustrative numerical examples, it is assumed that the magnitude of the jumps in the reference image, Y, are within about 20% to 30% of the exact time series images, $\{X(t)\}_{t=1}^4$.

Figure 5:
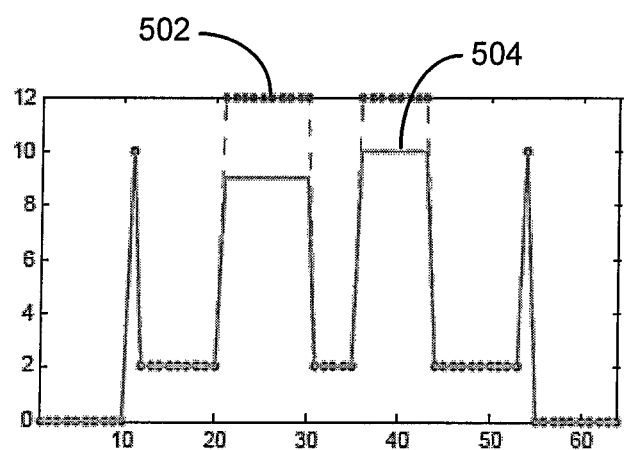
FIG. 5 is a diagram illustrating, in the form of intensity profiles, the prior edge information from the reference image of FIG. 3, and edge information for the time series of images of FIG. 4.

FIG. 5 depicts a cross-sectional view of edge information for the reference image, Y 502, and the time series image 504, at the first time point, X(1). As shown in FIG. 5, both the reference image, Y 502, and the time series image 504, have similar edge information, i.e., substantially the same jump locations, but different jump magnitudes.

The reconstruction of the time series images, $\{X(t)\}_{t=1}^4$, is described below using different sampling patterns, specifically, a uniform sampling pattern and a Gaussian sampling pattern, for the Fourier transform measurements, which correspond to different choices of the set, $\Omega$. It is noted that sampling patterns that place a higher number of samples near the zero frequency, such as the Gaussian sampling pattern, are preferred. For each sampling pattern, equation (32) is employed with $\lambda=\gamma=0.01$, and $\tau=0.1$.

It is noted that a cross-validation type approach may be used to determine the parameters, $\lambda$ and $\gamma$. Specifically, the "m" Fourier measurements, y, can be divided into "$m_r$" reconstruction samples, and "$m_v$" validation samples, which correspond to a new set of indices for reconstruction, $\Omega_r$, and a new set of indices for validation, $\Omega_v$, respectively. Multiple pairs, $(\lambda, \gamma)$, are chosen to solve equation (32), using the $m_r$ reconstruction samples. Further, in equation (32), $\hat{F}_\Omega$ and y are replaced with $\hat{F}_{\Omega_r}$ and $y_r$, respectively. For each pair, $(\lambda, \gamma)$, a reconstruction error, $\|\hat{F}_{\Omega_v} X^*_{\lambda, \gamma} - y_v\|_2$ is computed using the $m_v$ validation samples. The pair, $(\lambda, \gamma)$, can then be chosen for which the reconstruction error, $\|\hat{F}_{\Omega_v} X^*_{\lambda, \gamma} - y_v\|_2$ is the smallest.

For the reconstruction of the time series images, $\{X(t)\}_{t=1}^4$, using the uniform sampling pattern, "m" uniformly sampled Fourier transform measurements are obtained for the time series images, $\{X(t)\}_{t=1}^4$. FIG. 6 depicts the Fourier domain sampling pattern with uniform sampling. FIGS. 7a and 7b depict the uniform sampling pattern with m=410, or about 10% of the Fourier coefficients of the image. Specifically, FIGS. 7a, 7b depict edge information for the time series images, $\{X(t)\}_{t=1}^4$ 704, the reference image, Y 702, and the reconstruction of the time series images, $\{X(t)\}_{t=1}^4$ 706, with uniform sampling. FIG. 7a illustrates the edge information for the time series images, $\{X(t)\}_{t=1}^4$ 706, viewed along the center cross-section, with the 10% uniformly sampled Fourier coefficients and no edge data ($\gamma=0$). FIG. 7b illustrates the edge information for the time series images, $\{X(t)\}_{t=1}^4$ 706, viewed along the center cross-section, with the same 10% uniformly sampled Fourier coefficients and edge data ($\lambda=\gamma=0.01$, and $\tau=0.1$). It is noted that, in an actual image acquisition, such uniform sampling can be approximated using a non-Cartesian Fourier space trajectory.

Figure 7C:
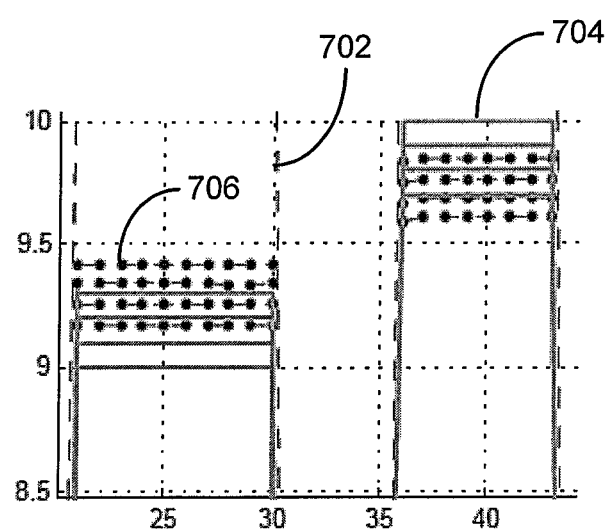
FIG. 7c is a diagram illustrating a close-up of the edge information of FIG. 7b, at a location of changing ellipse intensities.

Using the Fourier edge information from the reference image, Y, a substantially exact reconstruction of the time series images, $\{X(t)\}_{t=1}^4$, can be achieved. FIG. 7c depicts a close-up of the edge information illustrated in FIG. 7b, at the location of the changing ellipse intensities.

It is noted that about 30% uniformly sampled Fourier transform measurements would likely be required to obtain substantially exact reconstruction of the time series images, $\{X(t)\}_{t=1}^4$, $X(t) \in C^{64 \times 64}$, using the total-variation (TV) technique without prior (Fourier) edge information, which is an overall reduction of about 3.3 compared with full Fourier transform measurement acquisition. Using equation (32), which incorporates the prior (Fourier) edge information, a total reduction in Fourier transform measurements of about 10 can be achieved compared to full sampling and conventional image reconstruction.

Table II indicates the relative errors between the exact time series of images and the time series reconstructions, $X^*_i(t)$, i=1, 2, 3. In Table II, $X^*_1(t)$ represents the solution to equation (32) using the 10% uniformly sampled Fourier transform measurements and the prior (Fourier) edge information, $X^*_2(t)$ represents the solution to equation (32) using the same 10% uniformly sampled Fourier transform measurements and no prior (Fourier) edge information, and $X^*_3(t)$ represents the solution to equation (32) using the 30% uniformly sampled Fourier transform measurements and no prior (Fourier) edge information. A relative error, RelErr, is defined herein as $\text{RelErr}(X) := \|X^{exact}(t) - X_2\|/\|X_{exact}(t)\|$, in which "$X_{exact}(t)$" is the exact solution at time, t.

TABLE II

| t | RelErr($X_1^*$(t)) | RelErr($X_2^*$(t)) | RelErr($X_3^*$(t)) |
|---|---|---|---|
| 1 | 2.38% | 53.47% | 0.17% |
| 2 | 2.24% | 53.54% | 0.16% |
| 3 | 2.11% | 52.34% | 0.16% |
| 4 | 1.99% | 53.38% | 0.16% |

For the reconstruction of the time series images, $\{X(t)\}_{t=1}^4$, using Gaussian sampling, "m" Gaussian sampled Fourier coefficients are obtained from the time series images. FIG. 8 depicts the Gaussian sampling pattern with m=320, or about 8% of the Fourier coefficients of the image.

Figure 9C:
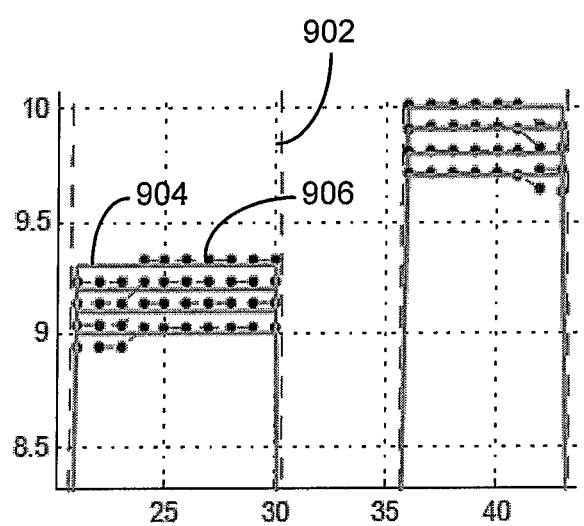
FIG. 9c is a diagram illustrating a close-up of the edge information of FIG. 9b, at a location of changing ellipse intensities.

FIGS. 9*a* and 9*b* provide a comparison of the image reconstruction with and without the prior (Fourier) edge information. Specifically, FIGS. 9*a*, 9*b* depict edge information for the time series images, $\{X(t)\}_{t=1}^4$ 904, the reference image, Y 902, and the reconstruction of the time series images, $\{X(t)\}_{t=1}^4$ 906. FIG. 9*a* depicts the edge information for the time series images, $\{X(t)\}_{t=1}^4$ 904, viewed along the center cross-section, with 8% Gaussian sampled Fourier coefficients and no edge data ($\gamma=0$). FIG. 9*b* depicts the edge information for the time series images, $\{X(t)\}_{t=1}^4$ 904, viewed along the center cross-section, with 8% Gaussian sampled Fourier coefficients and edge data ($\lambda=\gamma=0.01$, $\tau=0.1$). FIG. 9*c* depicts a close-up of the edge information illustrated in FIG. 9*b*, at the location of the changing ellipse intensities.

It is noted that about 20% Gaussian sampled Fourier transform measurements would likely be required, using the same density, to obtain substantially exact reconstruction of the time series images, $\{X(t)\}_{t=1}^4$, $X(t) \in C^{64 \times 64}$ using total-variation (TV) techniques without any prior (Fourier) edge information, which is an overall reduction of about 5 compared with full Fourier transform measurement acquisition. Using equation (32), which incorporates the prior (Fourier) edge information, a total reduction of about 12.5 can be achieved compared to full sampling and conventional image reconstruction.

Table III indicates the relative errors between the exact time series of images and the time series reconstructions, $X_i^*(t)$, i=1, 2, 3. In Table III, $X_1^*(t)$ represents the solution to equation (32) using the 8% Gaussian sampled Fourier transform measurements and the prior (Fourier) edge information, $X_2^*(t)$ represents the solution to equation (32) using the same 8% Gaussian sampled Fourier transform measurements and no prior (Fourier) edge information, and $X_3^*(t)$ represents the solution to equation (32) using the 20% Gaussian sampled Fourier transform measurements and no prior (Fourier) edge information.

TABLE III

| t | RelErr($X_1^*$(t)) | RelErr($X_2^*$(t)) | RelErr($X_3^*$(t)) |
|---|---|---|---|
| 1 | 0.72% | 31.29% | 0.14% |
| 2 | 0.71% | 31.16% | 0.14% |
| 3 | 0.70% | 31.25% | 0.15% |
| 4 | 0.69% | 31.26% | 0.14% |

For the reconstruction of the time series images, $\{X(t)\}_{t=1}^4$, using radial sampling, "m" radially sampled Fourier coefficients are obtained from the time series images. FIG. 10 depicts the radial sampling pattern with m=336, or about 8% of the Fourier coefficients of the image.

Figure 11C:
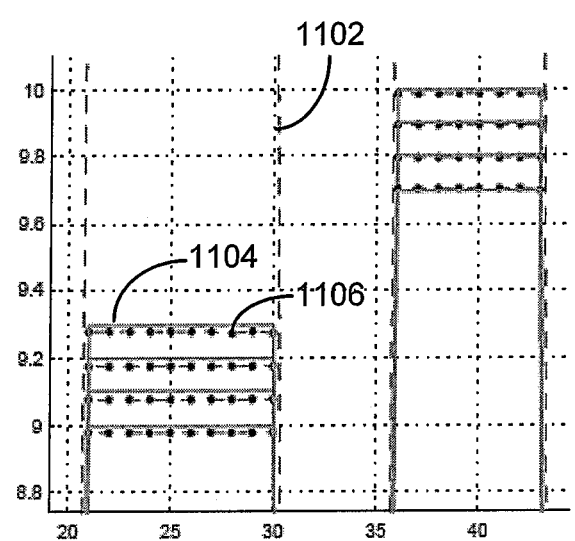
FIG. 11c is a diagram illustrating a close-up of the edge information of FIG. 11a, at a location of changing ellipse intensities.

FIGS. 11*a* and 11*b* provide a comparison of the image reconstruction with and without the prior (Fourier) edge information. Specifically, FIGS. 11*a*, 11*b* depict edge information for the time series images, $\{X(t)\}_{t=1}^4$ 1104, the reference image, Y 1102, and the reconstruction of the time series images, $\{X(t)\}_{t=1}^4$ 1106. FIG. 11*a* illustrates the edge information for the time series images, $\{X(t)\}_{t=1}^4$ 1106, viewed along the center cross-section, with the 8% radially sampled Fourier coefficients and edge data ($\lambda=\gamma=0.01$, and $\tau=0.1$). FIG. 11*b* illustrates the edge information for the time series images, $\{X(t)\}_{t=1}^4$ 1106, viewed along the center cross-section, with the 8% radially sampled Fourier coefficients and no edge data ($\gamma=0$). FIG. 11*c* depicts a close-up of the edge information illustrated in FIG. 11*a*, at the location of the changing ellipse intensities.

It is noted that about 23% radially sampled Fourier transform measurements would likely be required to obtain substantially exact reconstruction of the time series images, $\{X(t)\}_{t=1}^4$, $X(t) \in C^{64 \times 64}$ using total-variation (TV) techniques without any prior (Fourier) edge information, which is an overall reduction of about 4.3 compared with full Fourier transform measurement acquisition. Using equation (32), which incorporates the prior (Fourier) edge information, a total reduction of about 12.5 can be achieved compared to full sampling and conventional image reconstruction.

Table IV indicates the relative errors between the exact time series of images and the time series reconstructions, $X_i^*(t)$, i=1, 2, 3. In Table IV, $X_1^*(t)$ represents the solution to equation (32) using the 8% radially sampled Fourier transform measurements and the prior (Fourier) edge information, $X_2^*(t)$ represents the solution to equation (32) using the same 8% radially sampled Fourier transform measurements and no prior (Fourier) edge information, and $X_3^*(t)$ represents the solution to equation (32) using the 23% radially sampled Fourier transform measurements and no prior (Fourier) edge information.

TABLE IV

| t | RelErr($X_1^*$(t)) | RelErr($X_2^*$(t)) | RelErr($X_3^*$(t)) |
|---|---|---|---|
| 1 | 0.68% | 14.10% | 0.19% |
| 2 | 0.71% | 14.08% | 0.20% |
| 3 | 0.75% | 14.06% | 0.20% |
| 4 | 0.80% | 14.04% | 0.20% |

Figure 12:
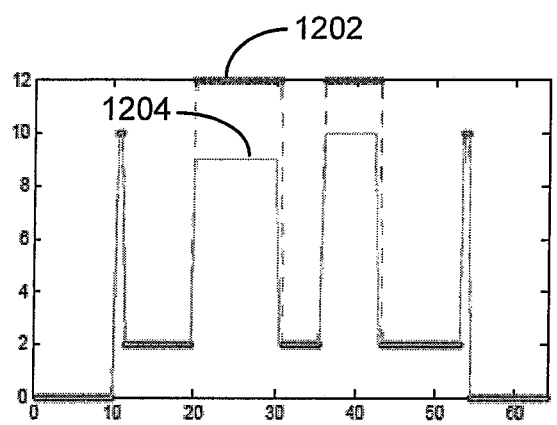
FIG. 12 is a diagram illustrating, in the form of intensity profiles, edge information for a time series of images, as well as prior edge information from a higher resolution reference image.

The second numerical example examines the reconstruction of the time series images, $\{X(t)\}_{t=1}^4$, $X(t) \in C^{64 \times 64}$, with Fourier transform information, $\hat{Y} \in C^{256 \times 256}$, from a reference image, $Y \in C^{256 \times 256}$, having high spatial resolution. In order to use the Fourier edge information from the higher resolution reference image, Y, a bilinear interpolation can be performed on the Fourier edge information, $\epsilon \hat{Y}$, which may introduce edge information that is inexact. FIG. 12 depicts Fourier edge information from the reference image, Y 1202, as determined by interpolations on the edge data, i.e., the interpolant, $\hat{I}_N(\epsilon_H \hat{Y})$. FIG. 12 further depicts the exact edge information for the time series images, $\{X(t)\}_{t=1}^4$ 1204. As shown in FIG. 12, the Fourier edge information from the reference image, Y 1202, is not exactly aligned with the edge information for the time series images, $\{X(t)\}_{t=1}^4$ 1204. In this second numerical example, the time series images, $\{X(t)\}_{t=1}^4$, are reconstructed using equation (34).

Figure 13:
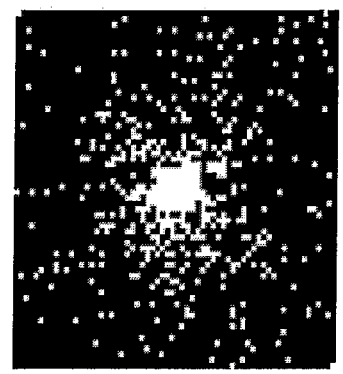
FIG. 13 illustrates another Fourier domain sampling pattern with Gaussian sampling density.

FIG. 13 depicts the Gaussian sampling pattern with m=484, or about 12% of the Fourier coefficients of the image.

Figures 14A, 14B:
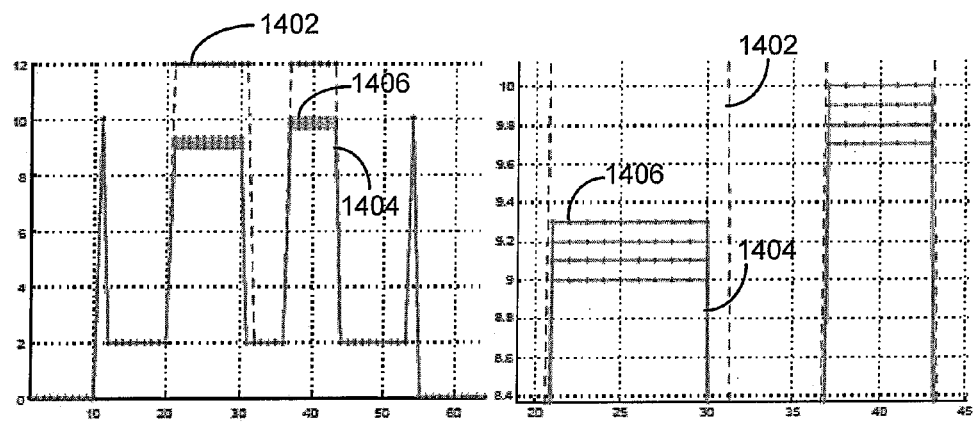
FIG. 14a is a diagram illustrating, in the form of intensity profiles, edge information for a time series of images, prior edge information from a higher resolution reference image, and edge information for a reconstruction of the time series of images, with Gaussian sampling density.
FIG. 14b is a diagram illustrating a close-up of the edge information of FIG. 14a, at a location of changing ellipse intensities.

FIGS. 14a and 14b depict edge information for the image under the 12% Gaussian sampling pattern using equation (34), which performs iterative re-weighting of the total-variation (TV) $l_1$ term. Specifically, FIGS. 14a, 14b depict the edge information for the time series images, $\{X(t)\}_{t=1}^{4}$ 1404, the reference image, Y 1402, and the reconstruction of the time series images, $\{X(t)\}_{t=1}^{4}$ 1406. FIG. 14a illustrates the edge information for the reconstruction of the time series images, $\{X(t)\}_{t=1}^{4}$ 1406, viewed along the center cross-section, with the 12% Gaussian sampled Fourier coefficients and edge data ($\lambda=\gamma=0.01$, and $\tau=0.1$), using equation (34). FIG. 14b depicts a close-up of the edge information illustrated in FIG. 14a, at the location of the changing ellipse intensities.

Table V indicates the relative errors between the exact time series of images and the time series reconstruction, $X^*_i(t)$, i=1, in which $X^*_1(t)$ represents the solution to equation (34) using the 12% Gaussian sampled Fourier transform measurements and the edge information.

TABLE V

| t | RelErr(X*(t)) |
|---|---|
| 1 | 5.21e−5% |
| 2 | 1.00e−4% |
| 3 | 7.82e−5% |
| 4 | 7.82e−4% |

It is noted that about 20% Gaussian sampled Fourier transform measurements would likely be required to obtain substantially exact reconstruction of the time series images, $\{X(t)\}_{t=1}^{4}$, $X(t) \in C^{64 \times 64}$ using total-variation (TV) techniques without any prior (Fourier) edge information, which is an overall reduction of about 5 compared with full Fourier transform measurement acquisition. Using equation (34), which incorporates the prior (Fourier) edge information, a total reduction of about 8 can be achieved compared to full sampling and conventional image reconstruction.

Figures 15A, 15B:
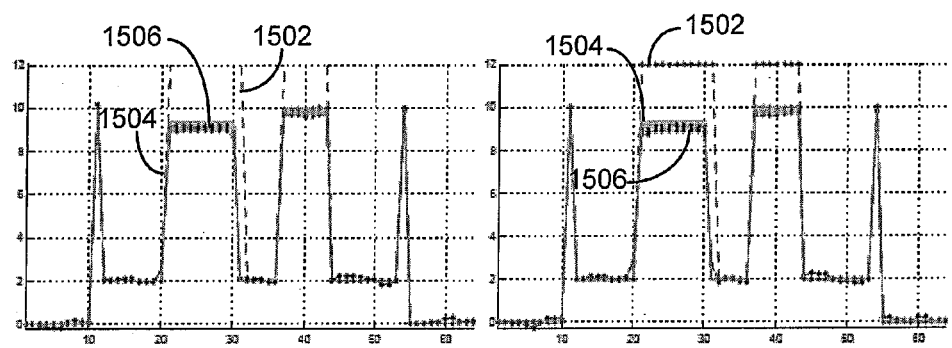
FIGS. 15a and 15b are diagrams illustrating, in the form of intensity profiles, edge information for a time series of images, prior edge information from a higher resolution reference image, and edge information for a reconstruction of the time series of images, with Gaussian sampling density, in the presence of measurement noise.

The same time series image reconstruction is now considered in the presence of measurement noise. For example, Gaussian noise can be added to the Fourier transform measurements, y, of the time series images, $\{X(t)\}_{t=1}^{4}$. A signal-to-noise (SNR) ratio is defined herein as the ratio between the maximum zero frequency of the time series images, $\{X(t)\}_{t=1}^{4}$, and the standard deviation of the Gaussian noise. FIGS. 15a and 15b depict edge information for the time series images, $\{X(t)\}_{t=1}^{4}$ 1504, the reference image, Y 1502, and the reconstruction of the time series images, $\{X(t)\}_{t=1}^{4}$ 1506. Specifically, FIG. 15a depicts the reconstruction of the time series images, $\{X(t)\}_{t=1}^{4}$ 1506, with the 12% Gaussian sampling pattern, for an SNR of 150. FIG. 15b depicts the reconstruction of the time series images, $\{X(t)\}_{t=1}^{4}$ 1506, with the 12% Gaussian sampling pattern, for an SNR of 100.

Table VI indicates the relative errors between the exact time series of images and the time series reconstructions, $X^*_i(t)$, i=1,2. In Table VI, $X^*_1(t)$ represents the solution to equation (34) with an SNR of 150, and $X^*_2(t)$ represents the solution to equation (34) with an SNR of 100.

TABLE VI

| t | RelErr(X*(t))(SNR = 150) | RelErr(X*(t))(SNR = 100) |
|---|---|---|
| 1 | 3.90% | 5.51% |
| 2 | 3.88% | 5.63% |
| 3 | 3.85% | 5.65% |
| 4 | 3.86 | 5.76% |

Figures 16A, 16B:
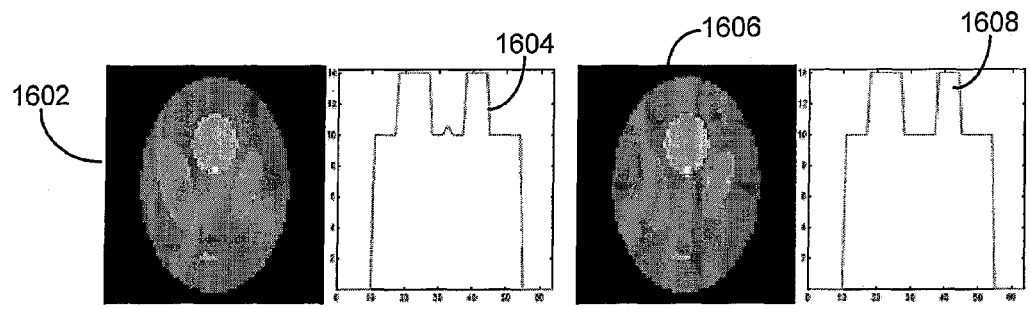
FIGS. 16a and 16b illustrate edge information, in the form of intensity profiles, for two images at different time points, as well as their center ellipse intensities.

In the third numerical example, a time series is considered in which a smaller ellipse is iso-intense with its surroundings, i.e., the ellipse is the same intensity as its surroundings at one time point, and changes intensity by about 1% at another time point. This increase in intensity corresponds to the activation of a region of interest in response to stimulus in a time series study. In the noiseless case, the time series will include two Shepp-Logan phantom images, in which only the intensity of the center ellipse is changing. FIG. 16a depicts the time series image, X(1) 1602, at time t=1, and its center cross-section 1604. FIG. 16b depicts the time series image, X(2) 1606, at time t=2, and its center cross-section 1608.

A high-resolution reference image, Y, can be used to provide approximate edge information for the sparse-gradient time series images X(1) 1602, X(2) 1606. The center ellipse intensities for the time series images X(1) 1602, X(2) 1606 can differ by about 1%, while the image intensity for the high-resolution reference image, Y, remains static. The center ellipse intensities for the time series images X(1) 1602, X(2) 1606, denoted by $e_c(t)$, are indicated in Table VII.

TABLE VII

| X(t) | $e_c(t)$ |
|---|---|
| X(1) | 10.0 |
| X(2) | 10.1 |
| Y | 12 |

Figure 17A:
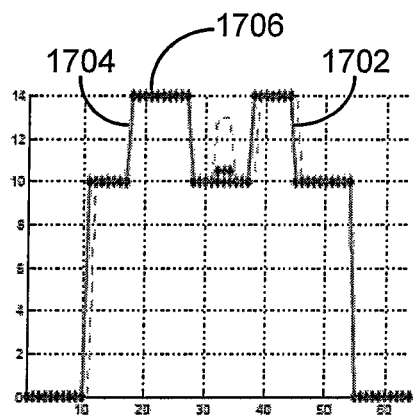
FIG. 17a is another diagram illustrating, in the form of intensity profiles, edge information for a time series of images, prior edge information from a higher resolution reference image, and edge information for a reconstruction of the time series of images, with Gaussian sampling density.
Figure 17B:
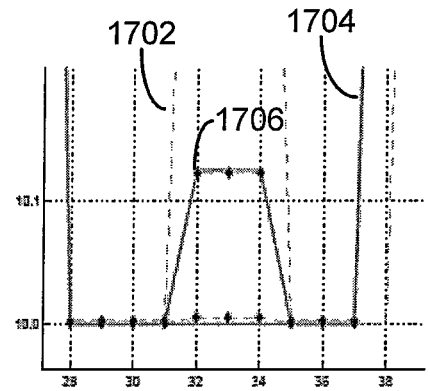
Figure 17C:
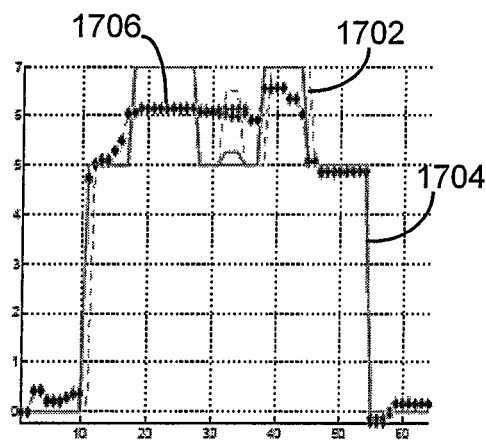
FIGS. 17c and 17d are diagrams illustrating, in the form of intensity profiles, the edge information for the time series of images of FIG. 17a, prior edge information from the higher resolution reference image of FIG. 17a, and edge information for the reconstructed time series of images of FIG. 17a, such time series of images being reconstructed with and without edge information, respectively.
Figure 17D:
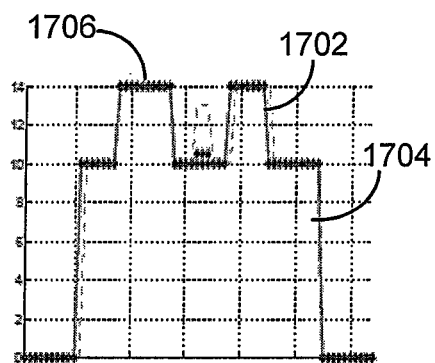

Using the same 12% Gaussian sampling pattern for the Fourier transform measurements as in FIG. 13, and inexact edge information, reconstruction of the time series images X(1) 1602, X(2) 1606 can be achieved using equation (34). FIGS. 17a and 17b depict the edge information for the higher resolution reference image, Y, 1702, the time series of images, X(1) 1704, and the reconstructed time series images, $X^*(t)$ 1706. Specifically, FIG. 17a depicts the edge information for the time series of images, X(t) 1704, viewed along the center cross-section, with 12% Gaussian sampled Fourier coefficients and edge data ($\lambda=\gamma=0.01$, $\tau=0.1$), using equation (34). FIG. 17b depicts a close-up of the edge information for the center ellipse illustrated in FIG. 17a. Further, FIGS. 17c and 17d depict the edge information following the reconstruction of the time series of images, X(t) 1704, with and without edge information, respectively, using equation (34) and the same 12% Gaussian sampling pattern.

It is noted that about 20% Gaussian sampled Fourier transform measurements would likely be required to obtain substantially exact reconstruction of the time series images, X(1), X(2), using total-variation (TV) techniques without any edge information, which is an overall reduction of about 5 compared with full Fourier transform measurement acquisition. Using equation (34), which incorporates the edge information, a total reduction of about 8 can be achieved compared to full sampling and conventional image reconstruction.

Table VIII indicates the relative errors between the exact time series of images and the time series reconstructions, $X^*_i(t)$, i=1,2. In Table VIII, $X^*_1(t)$ and $X^*_2(t)$ represent the solution to equation (34) for the iso-intense time series example discussed above, with and without edge information, respectively.

TABLE VIII

| t | RelErr($X_1^*$(t)) | RelErr($X_2^*$(t)) |
|---|---|---|
| 1 | 4.92e−4% | 16.10% |
| 2 | 1.35e−4% | 16.29% |

For the noisy case, a 32-point iso-intense time series example is considered, in which intensities of a small center ellipse is varying by about 1%. FIG. 18a illustrates the intensities 1802 of the center ellipse as a function of time, t=1, . . . , 32. FIG. 18b illustrates the ellipse intensities 1804 for the exact time series of images, the ellipse intensities 1806 for the image reconstruction with an SNR value of 150, and the ellipse intensities 1808 for the image reconstruction with an SNR value of 100, using equation (34) with 12% Gaussian sampled Fourier transform measurements and inexact edge information. The value of the ellipse intensity at each time point in FIG. 18b is the mean ellipse intensity, i.e., the mean value of the time points in the center ellipse. It is noted that the Pearson correlation coefficients for the ellipse intensities 1806 (SNR=150) and the ellipse intensities 1808 (SNR=100) are 0.9998 and 0.9968, respectively.

Figure 19:
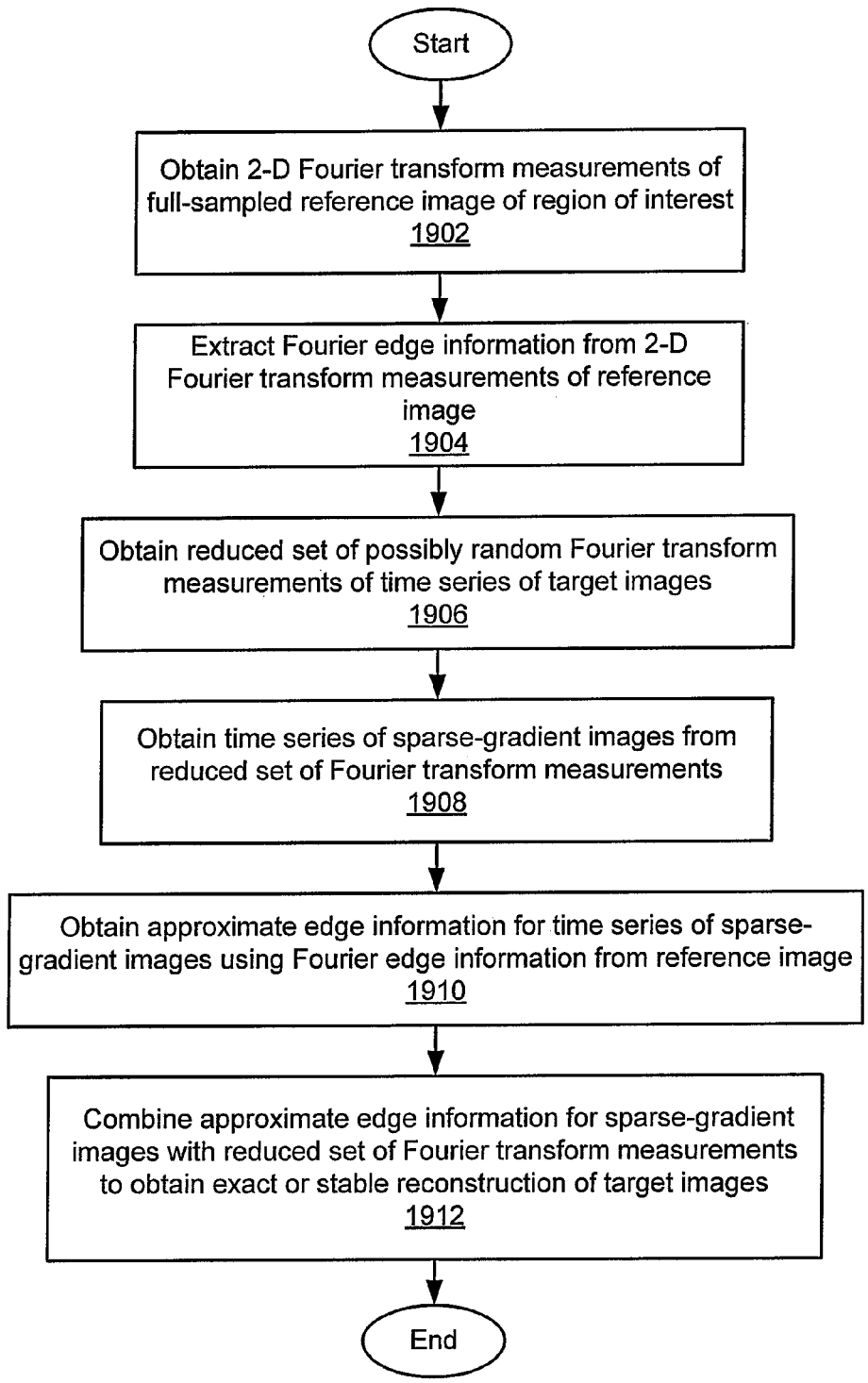
FIG. 19 is a flow diagram of a method of image acquisition and reconstruction employing a reduced set of Fourier transform measurements in conjunction with prior edge information obtained from a reference image, according to the present application.

A computer-implemented method of image acquisition and reconstruction that employs a reduced set of Fourier transform information and Fourier edge information obtained from a reference image is described below with reference to FIG. 19. As depicted in block 1902, 2-D Fourier transform measurements are obtained of a full-sampled reference image of a region of interest. As depicted in block 1904, Fourier edge information is extracted from the 2-D Fourier transform measurements of the reference image. As depicted in block 1906, a reduced set of possibly random Fourier transform measurements are obtained of the time series of target images. As depicted in block 1908, a time series of sparse-gradient images is obtained from the reduced set of Fourier transform measurements. As depicted in block 1910, using the Fourier edge information from the reference image, approximate edge information is obtained for the time series of sparse-gradient images. As depicted in block 1912, the approximate edge information for the sparse-gradient images is combined with the reduced set of Fourier transform measurements to obtain an exact or stable reconstruction of the target images.

It will be apparent that one or more embodiments described herein may be implemented in many different forms of software and/or hardware. For example, one or more embodiments described herein may include suitable configurations of one or more computerized devices, hardware processors, and/or the like to carry out and/or support any or all of the systems and/or methods described herein. Further, one or more computerized devices, processors, digital signal processors, etc., may be programmed and/or configured to implement the systems and methods described herein.

It will be appreciated by those of ordinary skill in the art that modifications to and variations of the above-described systems and methods may be made without departing from the inventive concepts disclosed herein. Accordingly, the invention should not be viewed as limited except as by the scope and spirit of the appended claims.

What is claimed is:

1. A computer-implemented method of reconstructing a time series of target images acquired by an imaging system, comprising the steps of:
    obtaining a set of Fourier transform measurements of a full-sampled reference image of a region of interest;
    extracting edge information from the set of Fourier transform measurements of the full-sampled reference image;
    obtaining a reduced set of Fourier transform measurements of a time series of target images of the region of interest;
    constructing sparse representations of the time series of target images from the reduced set of Fourier transform measurements;
    obtaining approximate edge information for the sparse representations of the time series of target images using the edge information extracted from the set of Fourier transform measurements of the full-sampled reference image; and
    reconstructing the time series of target images based on the reduced set of Fourier transform measurements of the time series of target images, and the approximate edge information for the sparse representations of the time series of target images.

2. The method of claim 1 wherein the obtaining of the set of Fourier transform measurements of the full-sampled reference image includes obtaining a set of 2-dimensional (2-D) Fourier transform measurements of the full-sampled reference image, and wherein the obtaining of the reduced set of Fourier transform measurements of the time series of target images includes obtaining a reduced set of 2-D Fourier transform measurements of the time series of target images.

3. The method of claim 1 wherein the obtaining of the set of Fourier transform measurements of the full-sampled reference image includes obtaining a set of 3-dimensional (3-D) Fourier transform measurements of the full-sampled reference image, and wherein the obtaining of the reduced set of Fourier transform measurements of the time series of target images includes obtaining a reduced set of 3-D Fourier transform measurements of the time series of target images.

4. The method of claim 1 wherein the obtaining of the reduced set of Fourier transform measurements includes obtaining a reduced set of random Fourier transform measurements of the time series of target images.

5. The method of claim 1 wherein the constructing of the sparse representations of the time series of target images includes performing a compressed sensing method to construct the sparse representations of the time series of target images.

6. The method of claim 5 wherein the sparse representations of the time series of target images exhibit sparsity in a gradient domain, and wherein the constructing of the sparse representations of the time series of target images further includes performing a total-variation minimization method to construct the sparse representations of the time series of target images from the reduced set of Fourier transform measurements.

7. The method of claim 1 wherein the reconstructing of the time series of target images includes performing an image regularization method.

8. The method of claim 7 wherein the image regularization method includes an error term incorporating the approximate edge information for the sparse representations of the time series of target images.

9. The method of claim 1 wherein the full-sampled reference image has a spatial resolution that is higher than that of the time series of target images, and wherein the obtaining of the approximate edge information for the sparse representations of the time series of target images includes performing a bilinear interpolation method on the edge information extracted from the set of Fourier transform measurements of the full-sampled reference image.

10. The method of claim 9 wherein the reconstructing of the time series of target images includes performing a weighted total-variation minimization method.

11. The method of claim 1 further comprising:
    sampling the reference image and the time series of target images in the region of interest using one of a uniform sampling pattern, a Gaussian sampling pattern, a radial sampling pattern, a spiral sampling pattern, a rosette sampling pattern, and an elliptical sampling pattern.

12. The method of claim 1 further comprising:
sampling the reference image and the time series of target images in the region of interest using a sampling pattern that combines characteristics of two or more of a uniform sampling pattern, a Gaussian sampling pattern, a radial sampling pattern, a spiral sampling pattern, a rosette sampling pattern, and an elliptical sampling pattern.

13. A functional magnetic resonance imaging (fMRI) system, comprising:
a controller including at least one processor operative to execute at least one program out of at least one memory:
to obtain a set of Fourier transform measurements of a full-sampled reference image of a region of interest;
to extract edge information from the set of Fourier transform measurements of the full-sampled reference image;
to obtain a reduced set of Fourier transform measurements of a time series of target images of the region of interest;
to construct sparse representations of the time series of target images from the reduced set of Fourier transform measurements;
to obtain approximate edge information for the sparse representations of the time series of target images using the edge information extracted from the set of Fourier transform measurements of the full-sampled reference image; and
to reconstruct the time series of target images based on the reduced set of Fourier transform measurements of the time series of target images, and the approximate edge information for the sparse representations of the time series of target images.

14. The system of claim 13 wherein the set of Fourier transform measurements of the full-sampled reference image is a set of 2-dimensional (2-D) Fourier transform measurements of the full-sampled reference image, and wherein the reduced set of Fourier transform measurements of the time series of target images is a reduced set of 2-D Fourier transform measurements of the time series of target images.

15. The system of claim 13 wherein the set of Fourier transform measurements of the full-sampled reference image is a set of 3-dimensional (3-D) Fourier transform measurements of the full-sampled reference image, and wherein the reduced set of Fourier transform measurements of the time series of target images is a reduced set of 3-D Fourier transform measurements of the time series of target images.

16. The system of claim 13 wherein the sparse representations of the time series of target images exhibit sparsity in a gradient domain.

17. The system of claim 13 wherein the at least one processor is further operative to execute the at least one program out of the at least one memory to reconstruct the time series of target images by performing an image regularization method.

18. The system of claim 17 wherein the image regularization method includes an error term incorporating the approximate edge information for the sparse representations of the time series of target images.

19. The system of claim 13 wherein the full-sampled reference image has a spatial resolution that is higher than that of the time series of target images, and wherein the at least one processor is further operative to execute the at least one program out of the at least one memory to perform a bilinear interpolation method on the edge information extracted from the set of Fourier transform measurements of the full-sampled reference image.

20. The system of claim 19 wherein the at least one processor is further operative to execute the at least one program out of the at least one memory to reconstruct the time series of target images by performing a weighted total-variation minimization method.

21. The system of claim 13 wherein the at least one processor is further operative to execute the at least one program out of the at least one memory to sample the reference image and the time series of target images in the region of interest using one of a uniform sampling pattern, a Gaussian sampling pattern, and a radial sampling pattern.

22. A computer-implemented method of reconstructing a time series of target images acquired by an imaging system, comprising the steps of:
obtaining a set of Fourier transform measurements of a full-sampled reference image of a region of interest;
extracting edge information from the set of Fourier transform measurements of the full-sampled reference image;
obtaining a reduced set of Fourier transform measurements of a time series of target images of the region of interest;
constructing sparse-gradient images from the reduced set of Fourier transform measurements of the time series of target images;
obtaining approximate edge information for the sparse-gradient images using the edge information extracted from the set of Fourier transform measurements of the full-sampled reference image; and
reconstructing the time series of target images based on the reduced set of Fourier transform measurements of the time series of target images, and the approximate edge information for the sparse-gradient images.

23. The method of claim 22 wherein the obtaining of the set of Fourier transform measurements of the full-sampled reference image includes obtaining a set of 2-dimensional (2-D) Fourier transform measurements of the full-sampled reference image, and wherein the obtaining of the reduced set of Fourier transform measurements of the time series of target images includes obtaining a reduced set of 2-D Fourier transform measurements of the time series of target images.

24. The method of claim 22 wherein the obtaining of the set of Fourier transform measurements of the full-sampled reference image includes obtaining a set of 3-dimensional (3-D) Fourier transform measurements of the full-sampled reference image, and wherein the obtaining of the reduced set of Fourier transform measurements of the time series of target images includes obtaining a reduced set of 3-D Fourier transform measurements of the time series of target images.

25. The method of claim 22 wherein the reconstructing of the time series of target images includes performing an image regularization method.

26. The method of claim 25 wherein the image regularization method includes an error term incorporating the approximate edge information for the sparse representations of the time series of target images.

27. The method of claim 22 wherein the full-sampled reference image has a spatial resolution that is higher than that of the time series of target images, wherein the obtaining of the approximate edge information for the sparse-gradient images includes performing a bilinear interpolation method on the edge information extracted from the set of Fourier transform measurements of the full-sampled reference image, and wherein the reconstructing of the time series of target images includes performing a weighted total-variation minimization method.

* * * * *